United States Patent
Lin et al.

(10) Patent No.: US 10,504,716 B2
(45) Date of Patent: Dec. 10, 2019

(54) METHOD FOR MANUFACTURING SEMICONDUCTOR DEVICE AND MANUFACTURING METHOD OF THE SAME

(71) Applicant: TAIWAN SEMICONDUCTOR MANUFACTURING COMPANY LTD., Hsinchu (TW)

(72) Inventors: Yung-Lung Lin, Taichung (TW); Hau-Yi Hsiao, Chiayi (TW); Chih-Hui Huang, Tainan County (TW); Kuo-Hwa Tzeng, Taipei (TW); Cheng-Hsien Chou, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/922,296

(22) Filed: Mar. 15, 2018

(65) Prior Publication Data

US 2019/0287788 A1    Sep. 19, 2019

(51) Int. Cl.
*H01L 21/762*    (2006.01)
*H01L 21/02*    (2006.01)
*H01L 21/306*    (2006.01)

(52) U.S. Cl.
CPC .. *H01L 21/02035* (2013.01); *H01L 21/02052* (2013.01); *H01L 21/02532* (2013.01); *H01L 21/30625* (2013.01); *H01L 21/76251* (2013.01)

(58) Field of Classification Search
CPC ............. H01L 21/304; H01L 21/02008; H01L 21/76251; H01L 21/02057; H01L 21/187; H01L 21/02238; H01L 21/02381; H01L 25/0657; H01L 2224/80; H01L 2224/32145; H01L 31/1812; H01L 31/03765; H01L 24/80; H01L 21/76256; H01L 21/02013; H01L 21/02019
See application file for complete search history.

(56) References Cited

U.S. PATENT DOCUMENTS

| 2002/0051731 A1* | 5/2002 | Fukami ................. C30B 29/06 422/40 |
| 2007/0072393 A1* | 3/2007 | Aspar ................... H01L 21/304 438/459 |
| 2010/0330506 A1 | 12/2010 | Knechtel |
| 2012/0329369 A1 | 12/2012 | Shimizu et al. |

OTHER PUBLICATIONS

Office Action and Search Report dated Oct. 14, 2019 issued by Taiwan Intellectual Property Office for counterpart application No. 107130201.

* cited by examiner

*Primary Examiner* — Caridad Everhart
(74) *Attorney, Agent, or Firm* — WPAT, P.C., Intellectual Property Attorneys; Anthony King

(57) ABSTRACT

The present disclosure provides a method for wafer bonding, including providing a wafer, forming a sacrificial layer on a top surface of the first wafer, trimming an edge of the first wafer to obtain a first wafer area, cleaning the top surface of the first wafer, removing the sacrificial layer, and bonding the top surface of the first wafer to a second wafer having a second wafer area greater than the first wafer area.

20 Claims, 33 Drawing Sheets

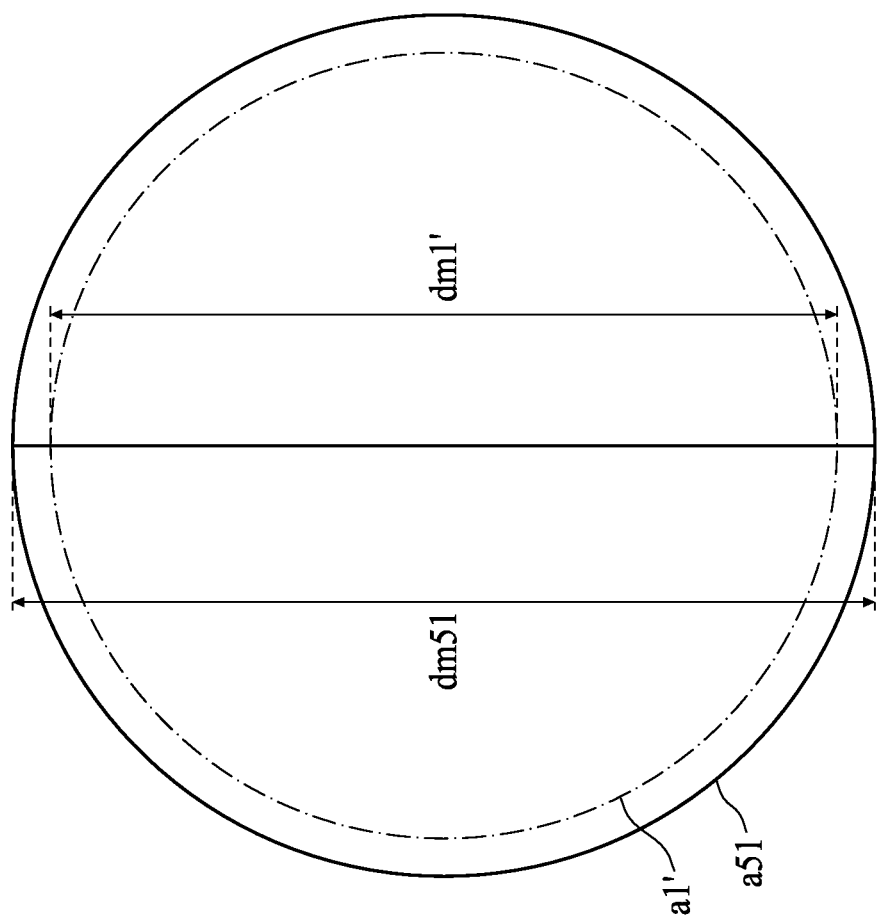

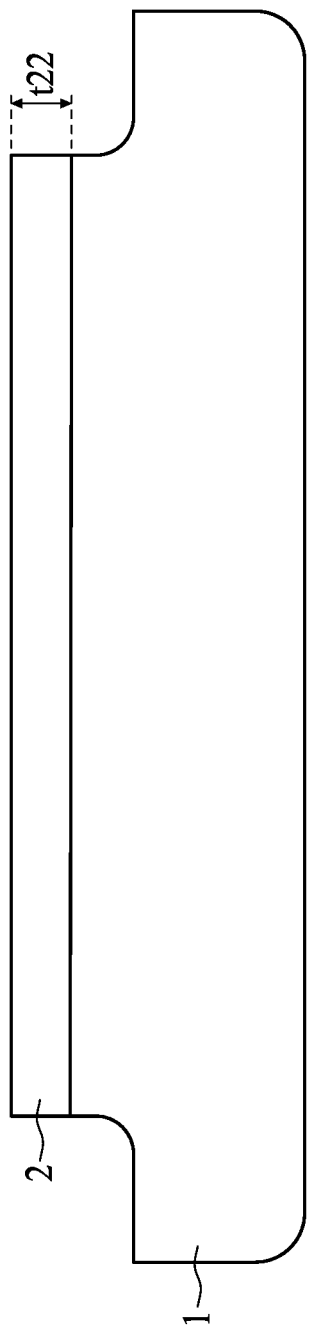

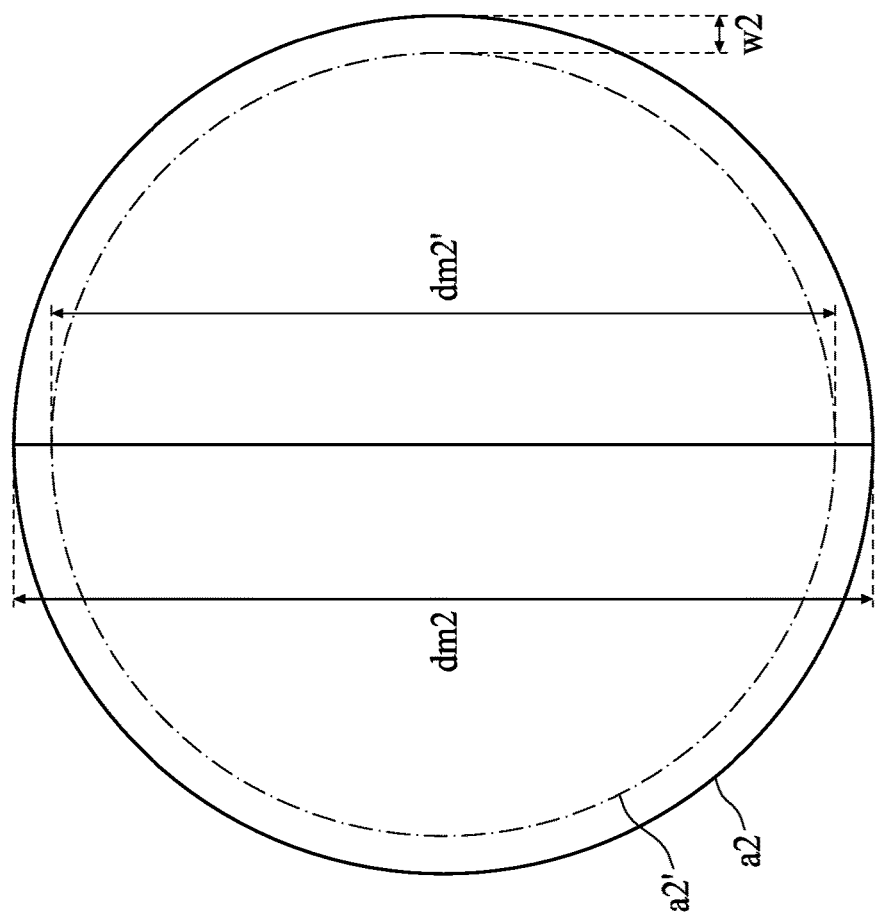

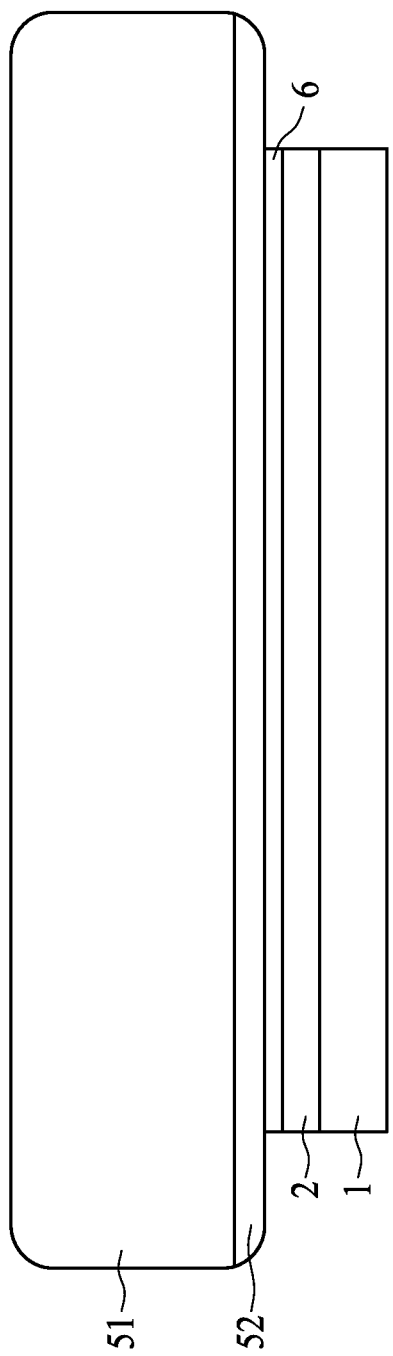

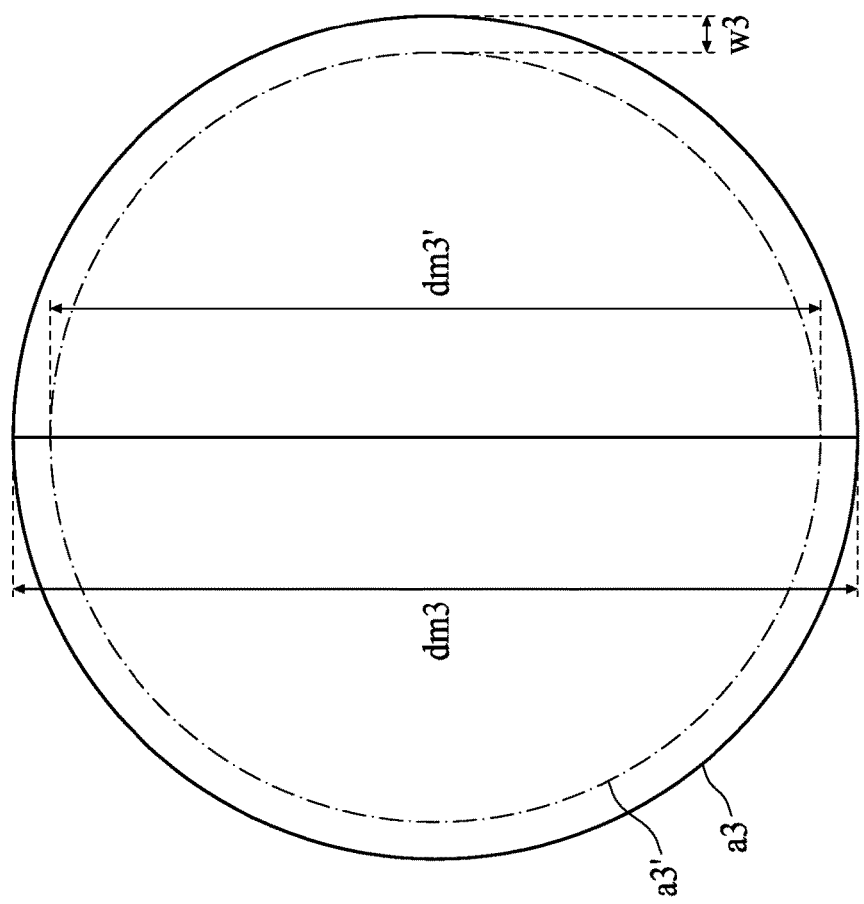

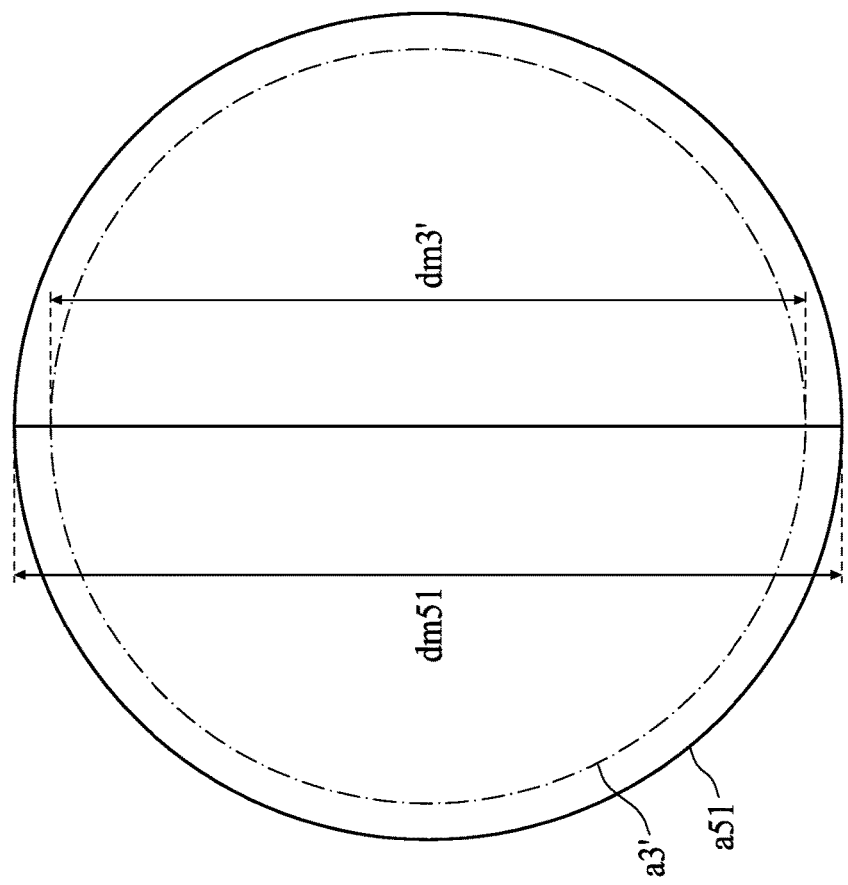

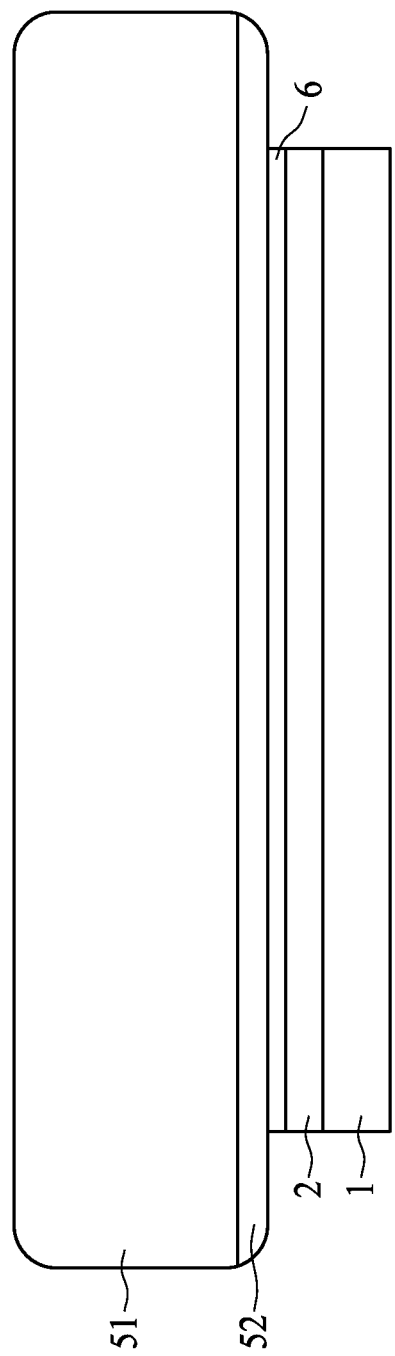

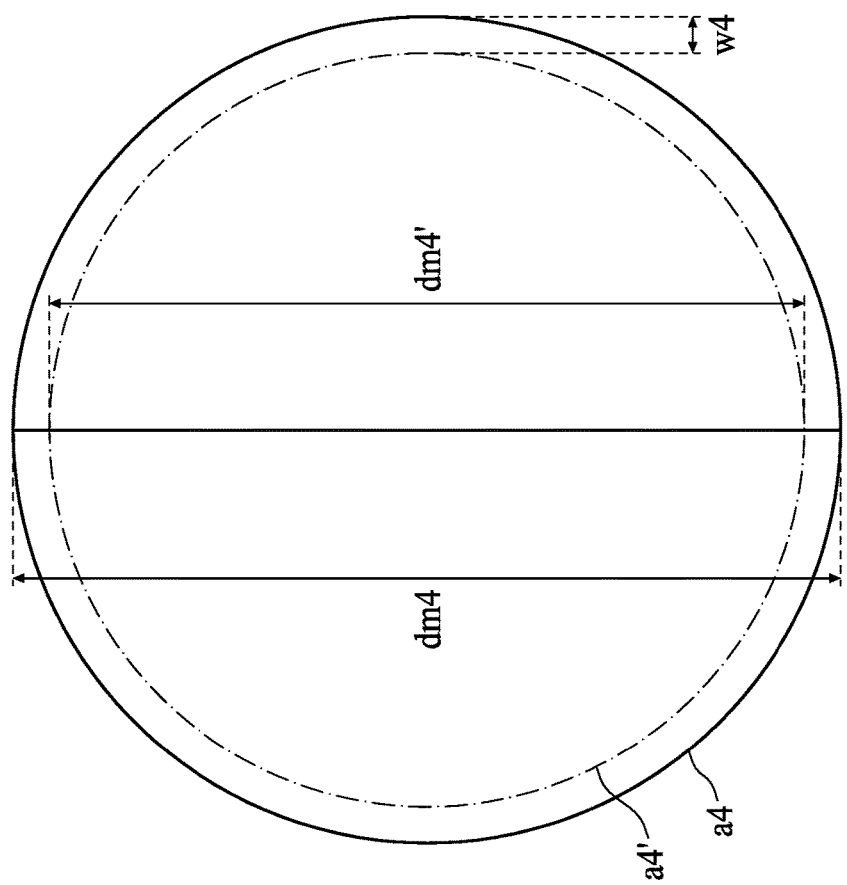

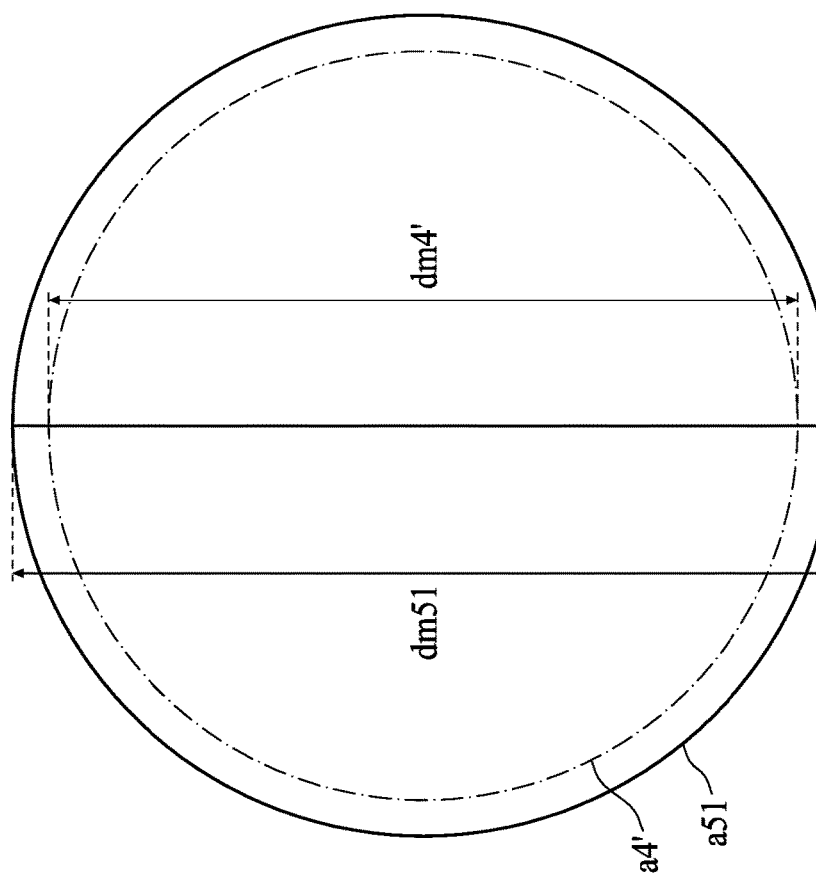

METHOD FOR MANUFACTURING SEMICONDUCTOR DEVICE AND MANUFACTURING METHOD OF THE SAME

BACKGROUND

The semiconductor industry uses thin wafers in the fabrication of semiconductor devices, thereby leading to the requirement of thinning down a bonded wafer. However, edge of the thinned wafer, known as the non-bond area, is prone to peel or crack and therefore damaging the semiconductor devices in the thinned wafer. Peeling defect from wafer edge is a key factor of production yield, therefore the treatment of wafer edge under wafer bonding scenario becomes more and more important to enhance production yield. For example, wafer edge trimming is one of the most common arts that can remove the non-bond area of the wafer before the bonding and thinning operation.

Yet during the process of wafer edge trimming, a great number of particles generated from the wafer edge would land on the pre-bond surface of the wafer. These particles could induce bonding bubbles, or gate oxide integrity (GOI) fail in silicon on insulator (SOI) development. Conventionally, cleaning process is applied to remove a portion but not all particles on the pre-bond wafer surface. Furthermore, the damaged surface caused by particles cannot be effectively recovered by cleaning process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C' is bottom view of wafer bonding at an intermediate stage, in accordance with some embodiments of the present disclosure.

FIG. 1D' is top view of wafer bonding at an intermediate stage, in accordance with some embodiments of the present disclosure.

FIG. 2A to FIG. 2D are cross sections of wafer bonding at various stages, in accordance with some embodiments of the present disclosure.

FIG. 2D' is bottom view of wafer bonding at an intermediate stage, in accordance with some embodiments of the present disclosure.

FIG. 2E' is top view of wafer bonding at an intermediate stage, in accordance with some embodiments of the present disclosure.

FIG. 2F is cross sections of wafer bonding at various stages, in accordance with some embodiments of the present disclosure.

FIG. 3E' is top view of wafer bonding at an intermediate stage, in accordance with some embodiments of the present disclosure.

FIG. 4E' is top view of wafer bonding at an intermediate stage, in accordance with some embodiments of the present disclosure.

DETAILED DESCRIPTION

Figure 1A:
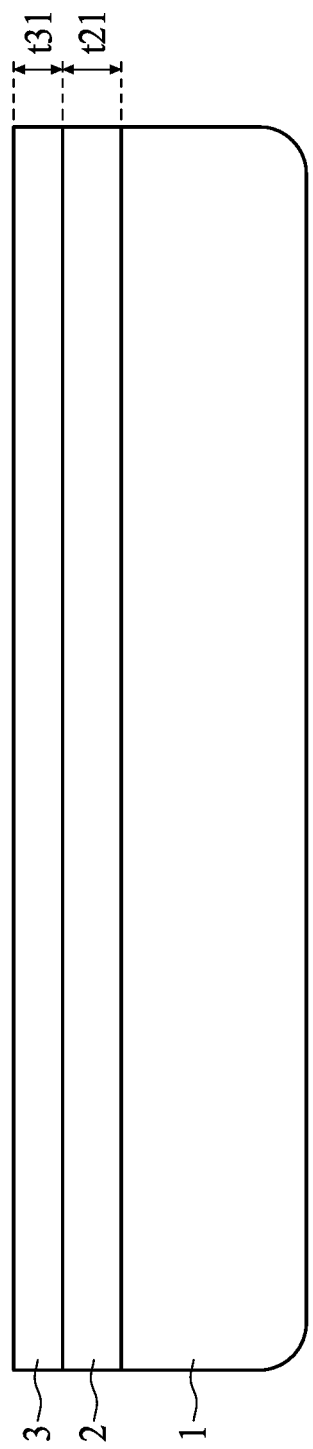
FIGS. 1A, 1B, and 1C are cross sections of wafer bonding at various stages, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides a method for wafer bonding and a method for forming an edge-trimmed wafer. The present disclosure removes contaminating particles and reduces damage on the pre-bond wafer surface during the wafer edge trimming process.

Referring to FIG. 1A through 1E, in some embodiments, a method for wafer bonding includes providing a first wafer 1, forming an epitaxial layer 2, forming a sacrificial layer 3, cleaning the top surface of the sacrificial layer 3 above the first wafer 1, removing the sacrificial layer 3, providing a second wafer 51, and bonding the first wafer 1 to the second wafer 51.

Referring to FIG. 1A, an epitaxial layer 2 is formed above the top surface of the wafer 1. In some embodiments, the thickness t21 of the epitaxial layer 2 is less than 10 μm. In some embodiments, before forming the epitaxial layer 2, a cleaning process, for example, a baseline cleaning, is applied on the top surface 101 (Shown in FIG. 1B) of the first wafer 1 in order to remove metal ions. In some embodiments, the material of the epitaxial layer 2 can be doped or undoped silicon germanium (SiGe). The epitaxial layer 2 may be formed by epitaxially growing a silicon germanium layer using a precursor free of chlorine. The precursor may include a silicon-containing source (such as $SiH_4$) and a germanium-containing source (such as $GeH_4$). However, the material of epitaxial layer 2 is not limited herein. The epitaxial layer 2 may include III-V compounds such as gallium nitride, gallium arsenide, or combinations of gallium, indium, aluminum, nitrogen, phosphorus or arsenic. After forming the epitaxial layer 2, a sacrificial layer 3 is further formed above the epitaxial layer 2. In some embodiments, the sacrificial layer 3 can be a layer of blanket deposited oxide capping layer.

Figure 1B:
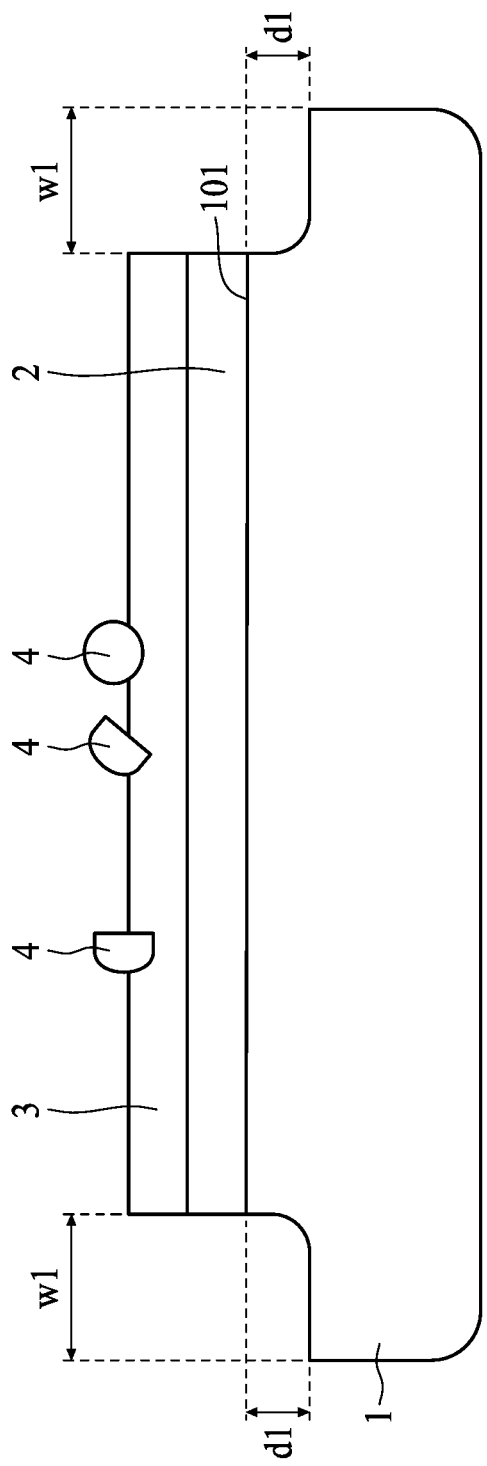

The edge of the first wafer 1, which is a non-bond area, is prone to peel or crack during the manufacturing process and further induce defects or damage on the device. Therefore the edge of the first wafer 1 needs to be trimmed before wafer bonding and/or thinning operation. Referring to FIG. 1B, the edge of the first wafer 1 is trimmed after the sacrificial layer 3 is formed. In some embodiments, the first wafer 1 is spun while a trimming tool (not shown in FIG. 1B) removes a predetermined portion of the edge around the surface 101 of the first wafer 1. In some embodiments, the trimmed edge of the first wafer 1 can be figured with a width w1 radially inward from about 1 mm to about 3 mm, and with a depth d1 from about 0.01 μm to about 200 μm, measured from the top surface 101 of the first wafer 1 to the bottom of the trimmed edge. The width w1 can at least be the radial portion of an unbond area but not too wide to reduce the radius of bond area. Determination of the depth d1 will be subsequently explained in FIG. 1E.

However, during the process of trimming the wafer edge, a great number of particles 4 may be ejected from the wafer edge, splattered over the top surface 101 of the wafer 1, and further damage the pre-bond wafer surface. In order to alleviate the defect caused by these particles 4 ejected from the edge, the aforesaid sacrificial layer 3 can serve as a surface protection. In some embodiments, the sacrificial layer 3 includes oxide capping layer. In some embodiments, the thickness t31 of the sacrificial layer 3 is between 500 angstrom to 50000 angstrom. After the edge trimming process, the top surface of the sacrificial layer 3 is cleaned. In some embodiments, the cleaning includes using a basic chemical and an acidic etching chemical, for example, ammonium hydroxide ($NH_4OH$) can be used to remove bigger size particles and hydrogen fluoride (HF) can be used to remove smaller size particles. The cleaning process includes chemical and physical means, for example, etching and brushing, in an alternate or concurrent fashion.

Figure 1C:
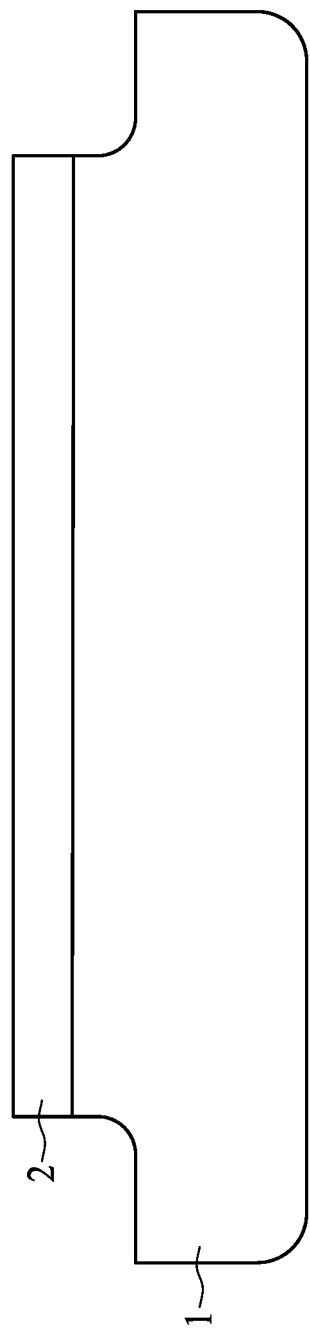
Figure 1C:
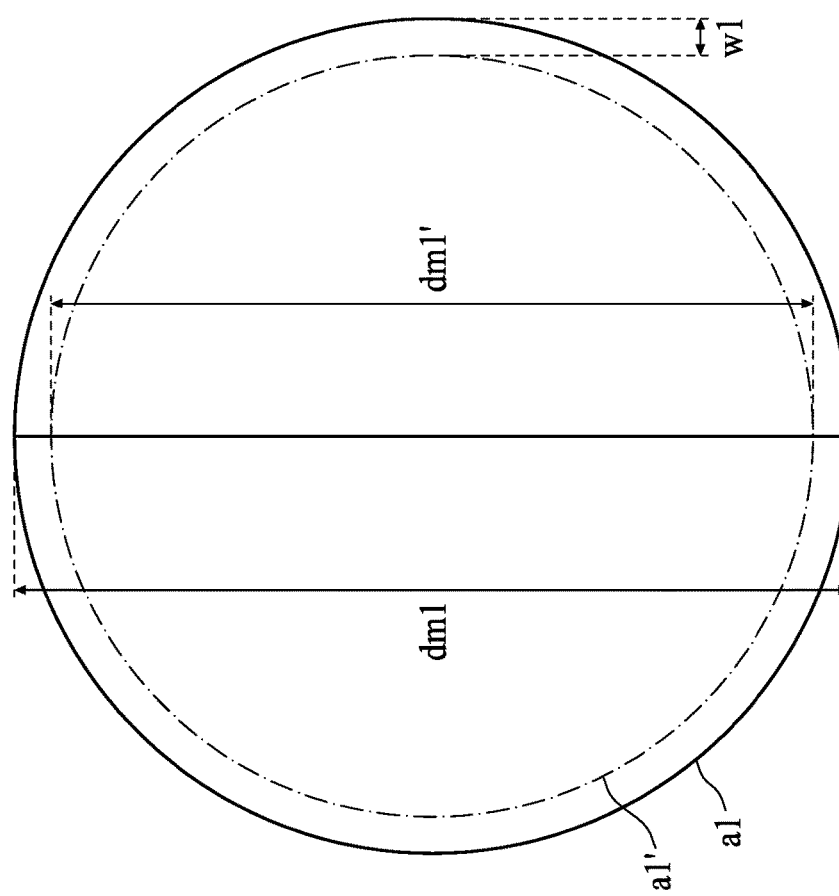

Referring to FIG. 1C, the sacrificial layer 3 is removed. In some embodiments, the sacrificial layer 3 can be removed by oxide etching, for example, by applying hydrogen fluoride. The etchant selected for sacrificial layer 3 removal shall not damage the top surface of epitaxial layer 2. A surface area a1', as shown in FIG. 1C', of the epitaxial surface is reduced, compared to its untrimmed counterpart, that is, the untrimmed portion of the first wafer 1 under the epitaxial layer 2. For example, the bottom view of the first wafer 1 shows that the untrimmed counterpart possesses a transverse surface area a1, and the trimmed portion of the wafer possesses a transverse surface area a1'. Alternatively stated, the diameter dm1 of the surface area a1 is greater than the diameter dm2 of the surface area a1' by the width w1, as previously discussed.

Figure 1D:
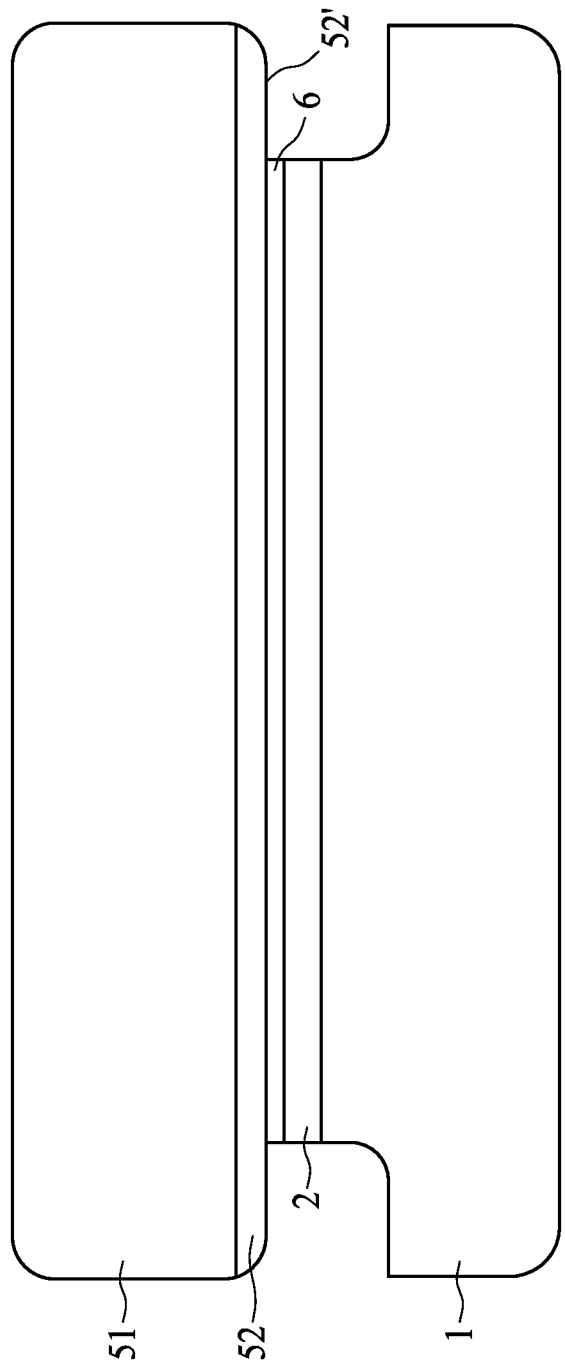
FIG. 1D is cross sections of wafer bonding at various stages, in accordance with some embodiments of the present disclosure.

Wafer thinning is commonly used in semiconductor device manufacturing because thinning enables devices to be stacked and helps dissipate heat. However, thinner substrates are relatively more difficult to handle without damage to the substrate or to the integrated circuit components thereon. To alleviate some of the difficulties, device wafer is commonly attached to another wafer prior to the thinning operation. Referring to FIGS. 1D and 1D', an oxide layer 6 for bonding is formed above the top surface of the epitaxial layer 2, and the oxide layer 6 of the first wafer 1 can be bonded with the bonding layer 52 on a bonding surface 52' of the second wafer 51, while a transverse surface area a51 of the second wafer 51 is greater than the transverse surface area a1' of the trimmed portion of the first wafer 1. Alternatively stated, the diameter dm51 of the second wafer 51 is greater than the diameter dm1' of the trimmed portion of the first wafer 1. In some embodiments, the first wafer 1 and the second wafer 51 are bonded by wafer-bonding level thermal annealing, as the oxide layer 6 may be formed by standard plasma activation-deposition, and the bonding layer 52 includes oxide such as $SiO_2$. The first wafer 1 and the second wafer 51 may also be bonded together through other suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like.

Figure 1E:
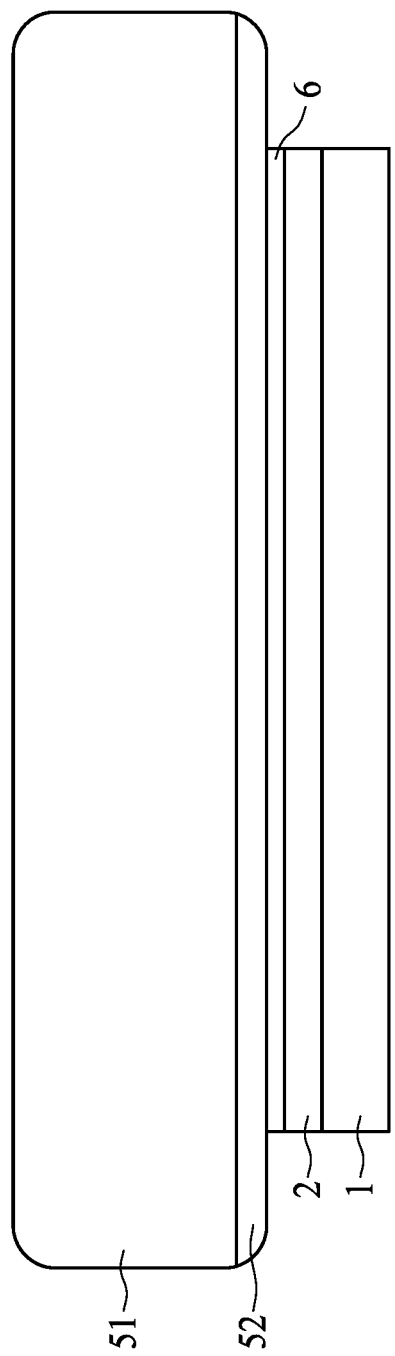
FIG. 1E is cross sections of wafer bonding at various stages, in accordance with some embodiments of the present disclosure.

Referring to FIG. 1E, in some embodiments, the first wafer 1 is thinned by a backside grinding operation. The original thickness of the first wafer 1 is approximately 700 µm to 800 µm, and the thickness of the first wafer 1 will be reduced to less than 10 µm after the backside grinding operation, or until the backside surface area of the first wafer 1 is substantially equal to the transverse surface area a1'. Due to the potential cracks or breakage induced during the backside grinding operation, the depth d1 of the trimmed edge of the first wafer 1 must be far greater than 10 µm. In some embodiments, a trimmed depth between 0.01 µm to about 200 µm is determined considering potential crack propagation during the progress of thinning. Alternatively stated, an extra 40 µm to 190 µm of depth is preserved for potential crack propagation, so that sufficient thickness can be trimmed without affecting the 10 µm device region proximal to the bonding surface.

Referring to FIG. 2A through 2F, in some embodiments, a method for wafer bonding includes providing a first wafer 1, forming a sacrificial layer 3, cleaning the top surface of the sacrificial layer 3 above the first wafer 1, removing the sacrificial layer 3, forming an epitaxial layer 2, providing a second wafer 51, and bonding the first wafer 1 to the second wafer 51. The area of the second wafer 51 is greater than the wafer area of the first wafer 1.

Figure 2A:
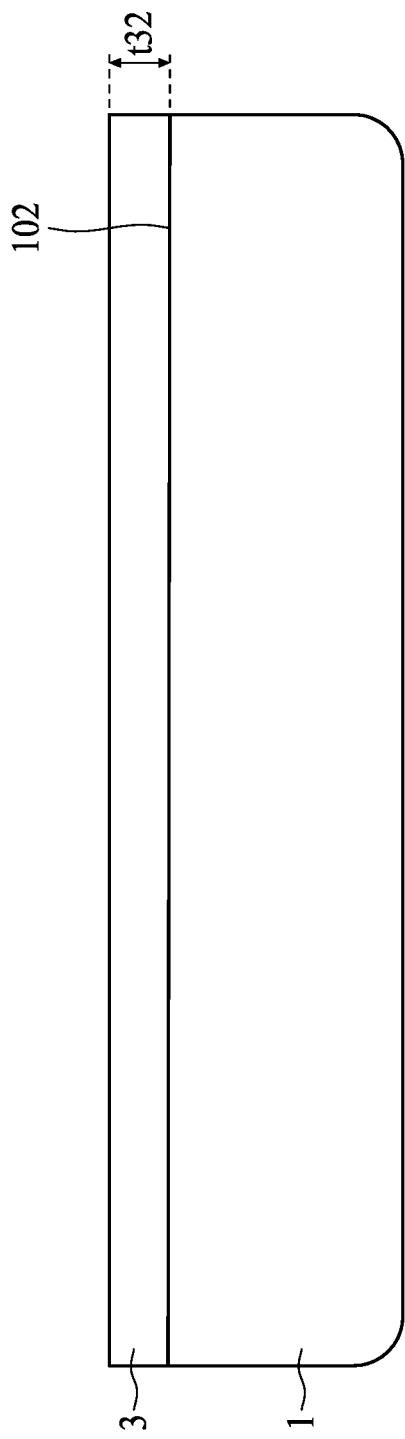

During the process of trimming the wafer edge, a great number of particles 4 may be ejected from the wafer edge, splattered over the top surface 102 of the wafer 1, and further damage the pre-bond wafer surface. Referring to FIG. 2A, in order to alleviate the defect caused by these particles 4 ejected from the edge, a sacrificial layer 3 is formed above the top surface 102 of the wafer 1 to serve as a surface protection. In some embodiments, the sacrificial layer 3 can be a layer of blanket deposited oxide capping layer. In some embodiments, the thickness t32 of the sacrificial layer 3 is between 500 angstrom to 50000 angstrom.

Figure 2B:
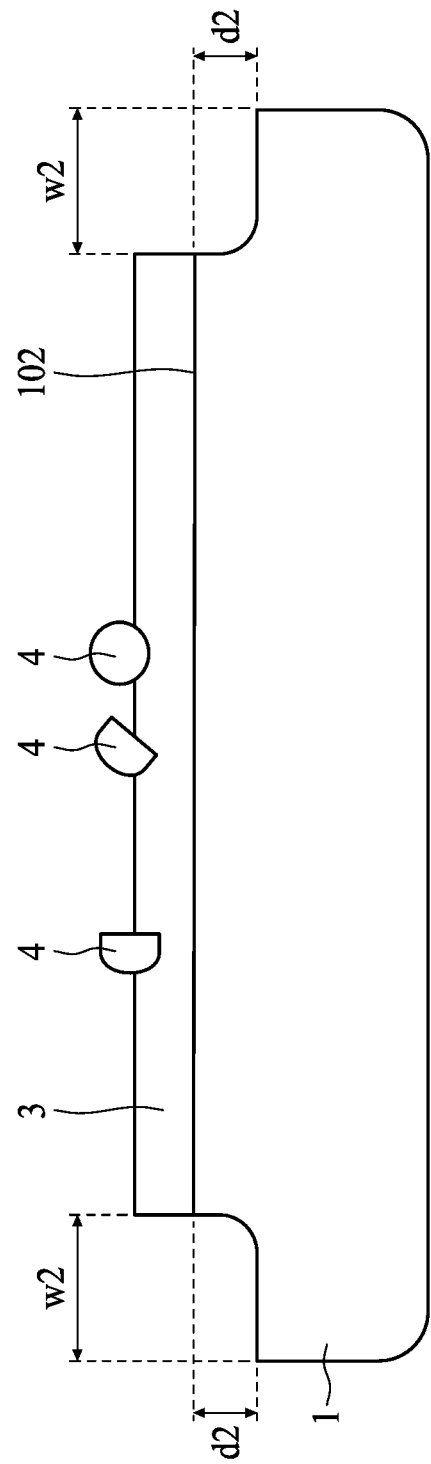

The edge of the first wafer 1, which is a non-bond area, is prone to peel or crack during the manufacturing process and further induce defects or damage on the device. Therefore the edge of the first wafer 1 needs to be trimmed before wafer bonding and/or thinning operation. Referring to FIG. 2B, the edge of the first wafer 1 is trimmed after the sacrificial layer 3 is formed. In some embodiments, the first wafer 1 is spun while a trimming tool (not shown in FIG. 2B) removes a predetermined portion of the edge around the surface 102 of the first wafer 1. In some embodiments, the trimmed edge of the first wafer 1 can be figured with a width w2 radially inward from about 1 mm to about 3 mm, and with a depth d2 from about 0.01 µm to about 200 µm, measured from the top surface 102 of the first wafer 1 to the bottom of the trimmed edge. The width w2 can at least be the radial portion of an unbond area but not too wide to reduce the radius of bond area. Determination of the depth d2 will be subsequently explained in FIG. 2F.

Figure 2C:
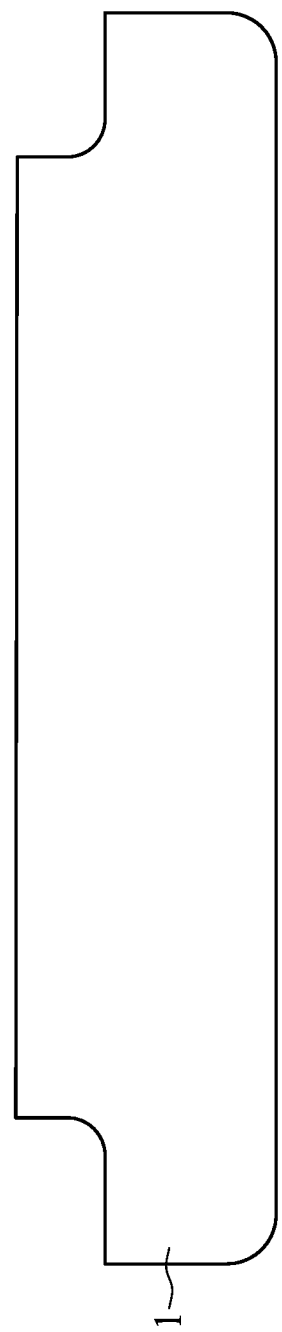

After the edge trimming process, the top surface of the sacrificial layer 3 is cleaned. In some embodiments, the cleaning includes using a basic chemical and an acidic etching chemical, for example, ammonium hydroxide ($NH_4OH$) can be used to remove bigger size particles and hydrogen fluoride (HF) can be used to remove smaller size particles. The cleaning process includes chemical and physical means, for example, etching and brushing, in an alternate or concurrent fashion. Subsequently the sacrificial layer 3 is removed as shown in FIG. 2C. In some embodiments, the sacrificial layer 3 can be removed by oxide etching, for example, by applying hydrogen fluoride. In some embodiments, the cleaning includes using a basic chemical and an acidic etching chemical, for example, ammonium hydroxide ($NH_4OH$) can be used to remove bigger size particles and hydrogen fluoride (HF) can be used to remove smaller size particles. The cleaning process includes chemical and physical means, for example, etching and brushing, in an alternate or concurrent fashion.

Referring to FIG. 2D, an epitaxial layer 2 is formed above the top surface of the wafer 1. In some embodiments, the thickness t22 of the epitaxial layer 2 is less than 10 µm. In some embodiments, before forming the epitaxial layer 2, a cleaning process, for example, a baseline cleaning, is applied on the top surface 102 (Shown in FIG. 2B) of the first wafer 1 in order to remove metal ions. In some embodiments, the material of the epitaxial layer 2 can be doped or undoped silicon germanium (SiGe). The epitaxial layer 2 may be formed by epitaxially growing a silicon germanium layer using a precursor free of chlorine. The precursor may include a silicon-containing source (such as $SiH_4$) and a germanium-containing source (such as $GeH_4$). However, the material of epitaxial layer 2 is not limited herein. The epitaxial layer 2 may include III-V compounds such as gallium nitride, gallium arsenide, or combinations of gallium, indium, aluminum, nitrogen, phosphorus or arsenic.

A surface area a2', as shown in FIG. 2D', of the epitaxial surface is reduced, compared to its untrimmed counterpart, that is, the untrimmed portion of the first wafer 1 under the epitaxial layer 2. For example, the bottom view of the first wafer 1 shows that the untrimmed counterpart possesses a transverse surface area a2, and the trimmed portion of the wafer possesses a transverse surface area a2'. Alternatively stated, the diameter dm2 of the surface area a2 is greater than the diameter dm2' of the surface area a2' by the width w2, as previously discussed.

Figure 2E:
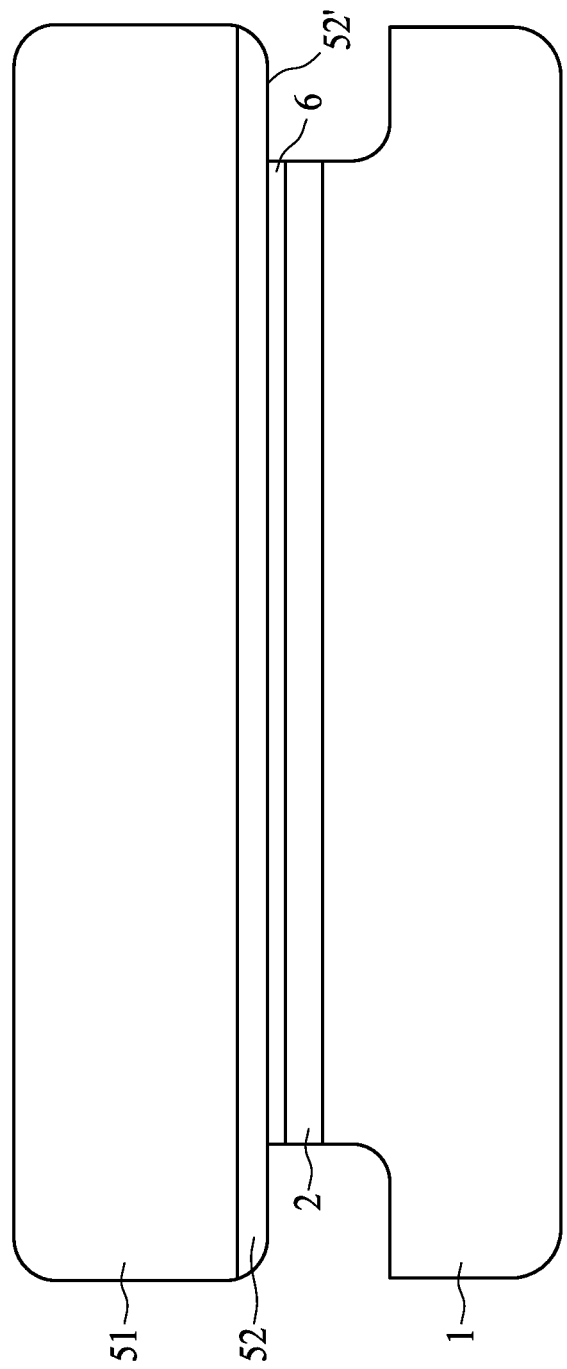
FIG. 2E is cross sections of wafer bonding at various stages, in accordance with some embodiments of the present disclosure.
Figure 2E:
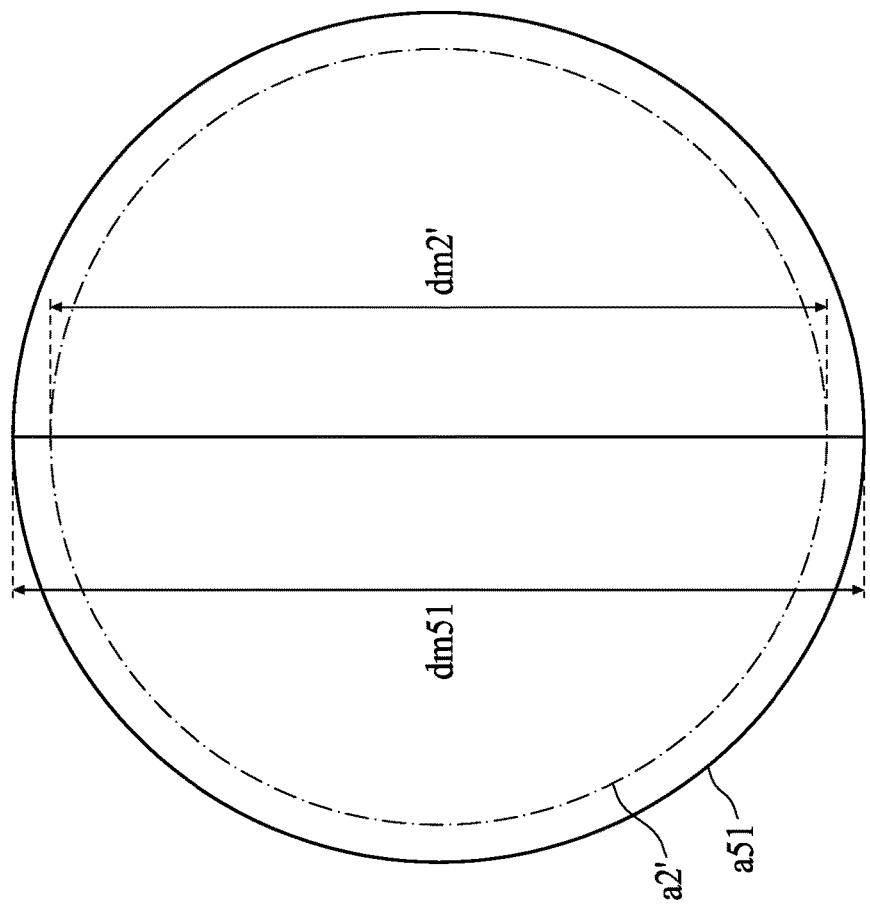

Wafer thinning is commonly used in semiconductor device manufacturing because thinning enables devices to be stacked and helps dissipate heat. However, thinner substrates are relatively more difficult to handle without damage to the substrate or to the integrated circuit components thereon. To alleviate some of the difficulties, device wafer is commonly attached to another wafer prior to the thinning operation. Referring to FIGS. 2E and 2E', an oxide layer 6 for bonding is formed above the top surface of the epitaxial layer 2, and the oxide layer 6 of the first wafer 1 can be bonded with the bonding layer 52 on a bonding surface 52', while a transverse surface area a51 of the second wafer 51 is greater than the transverse surface area a2' of the trimmed portion of the first wafer 1, that is, a diameter dm51 of the second wafer 51 is greater than a diameter dm2' of the trimmed portion of the first wafer 1. In some embodiments, the first wafer 1 and the second wafer 51 are bonded by wafer-bonding level thermal annealing, as the oxide layer 6 may be formed by standard plasma activation-deposition, and the bonding layer 52 includes oxide such as $SiO_2$. The first wafer 1 and the second wafer 51 may also be bonded together through other suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like.

Referring to FIG. 2F, in some embodiments, the first wafer 1 is thinned by a backside grinding operation. The original thickness of the first wafer 1 is approximately 700 µm to 800 µm, and the thickness of the first wafer 1 will be reduced to less than 10 µm after the backside grinding operation, or until the backside surface area of the first wafer 1 is substantially equal to the transverse surface area a2'. Due to the potential cracks or breakage induced during the backside grinding operation, the depth d2 of the trimmed edge of the first wafer 1 must be far greater than 10 μm. In some embodiments, a trimmed depth between 0.01 μm to about 200 μm is determined considering potential crack propagation during the progress of thinning. Alternatively stated, an extra 40 μm to 190 μm of depth is preserved for potential crack propagation, so that sufficient thickness can be trimmed without affecting the 10 μm device region proximal to the bonding surface.

Referring to FIG. 3A through 3F, in some embodiments, a method for wafer bonding includes providing a first wafer 1 having a first bonding surface 103, edge-trimming the first wafer 1 at the first bonding surface 103, cleaning the bonding surface by a basic and an acidic etch, performing chemical mechanical polishing (CMP) on the first wafer 1, and forming a SiGe epitaxial layer 2.

Figure 3A:
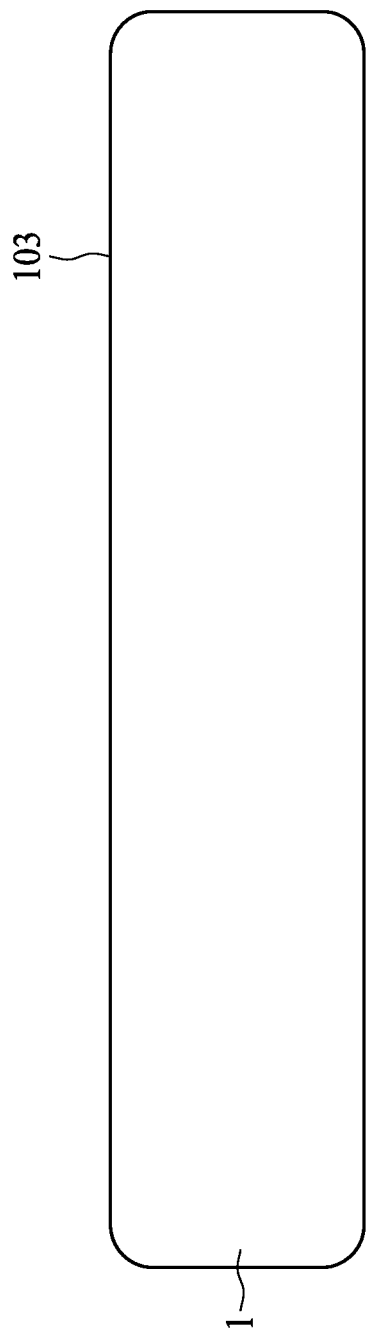
FIGS. 3A, 3B, 3B', 3C, and 3D are cross sections of wafer bonding at various stages, in accordance with some embodiments of the present disclosure.
Figure 3B:
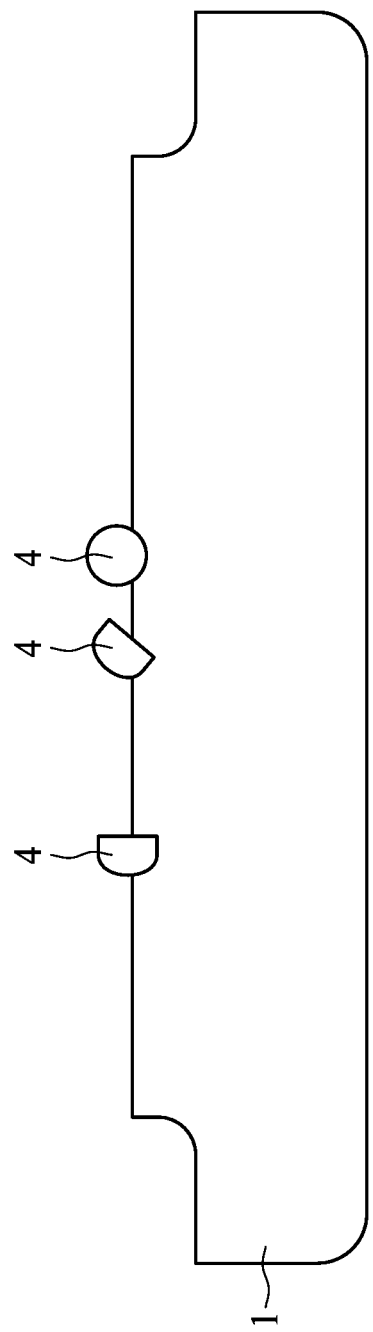
Figure 3B:
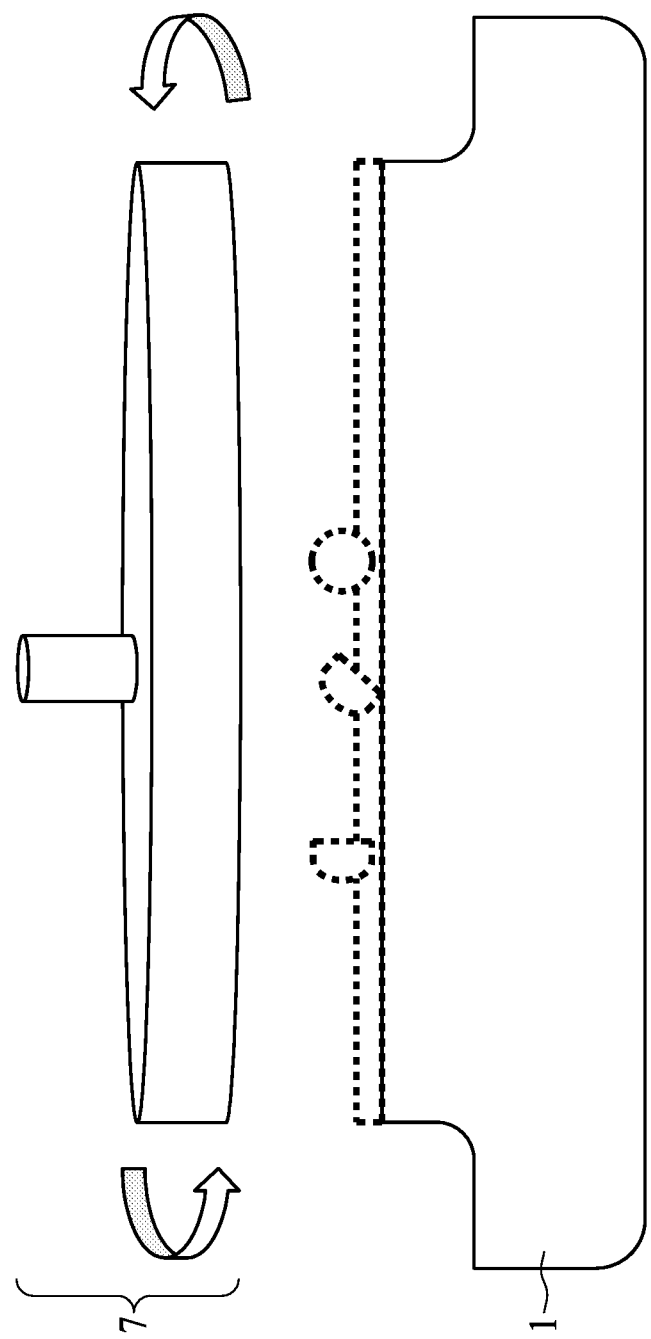

A first wafer 1 has a first bonding surface 103, as shown in FIG. 3A. The edge of the first wafer 1, which is a non-bond area, is prone to peel or crack during the manufacturing process and further induce defects or damage on the device. Therefore the edge of the first wafer 1 needs to be trimmed before wafer bonding and/or thinning operation. Referring to FIG. 3B, the edge of the first wafer 1 is trimmed. In some embodiments, the first wafer 1 is spun while a trimming tool (not shown in FIG. 3B) removes a predetermined portion of the edge around the first bonding surface 103 of the first wafer 1. During the process of trimming the wafer edge, a great number of particles 4 may be ejected from the wafer edge, splattered over and damage the top surface 103 of the wafer 1. In order to remove the particles 4 on the first bonding surface 103, the first bonding surface 103 is cleaned. In some embodiments, the cleaning includes using a basic chemical and an acidic etching chemical, for example, ammonium hydroxide (NH$_4$OH) can be used to remove bigger size particles and hydrogen fluoride (HF) can be used to remove smaller size particles. The cleaning process includes chemical and physical means, for example, etching and brushing, in an alternate or concurrent fashion.

Figure 3C:
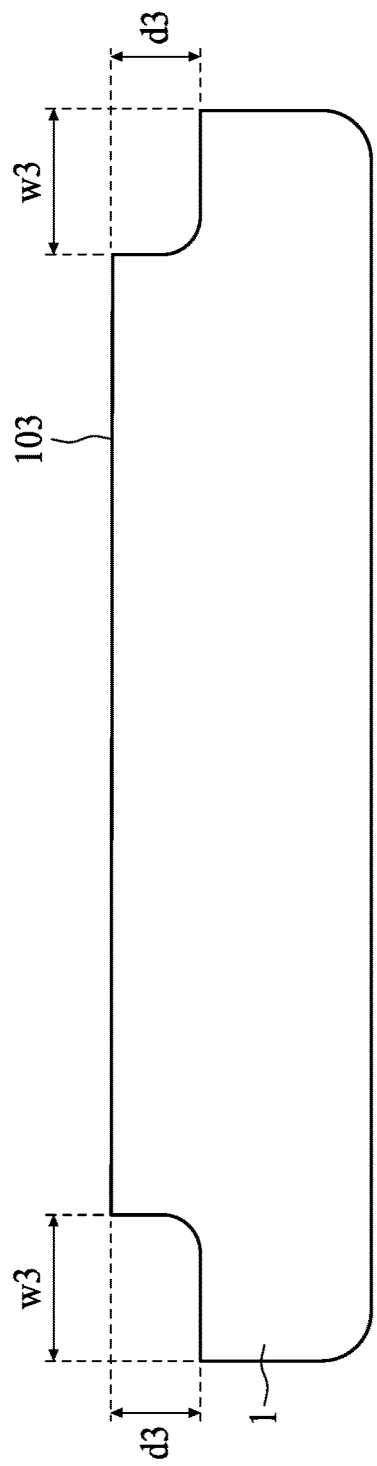
FIG. 3D' is bottom view of wafer bonding at an intermediate stage, in accordance with some embodiments of the present disclosure.
FIG. 3E is cross sections of wafer bonding at various stages, in accordance with some embodiments of the present disclosure.
FIG. 3F is cross sections of wafer bonding at various stages, in accordance with some embodiments of the present disclosure.

In some embodiments, the damage on the top surface 103 caused by the particles 4 is further recovered by applying chemical mechanical polishing (CMP) 7 to remove a small part proximal to the first bonding surface 103, as shown in FIG. 3B'. Thence ashing process and hydrogen fluoride (HF) etching can be applied on the first bonding surface 103 to remove residual substances caused by CMP 7. Referring to FIG. 3C, in some embodiments, after the CMP 7, ashing and hydrogen fluoride (HF) etching are applied on the first bonding surface 103, the trimmed edge of the first wafer 1 may possess a width w3 radially inward from about 1 mm to about 3 mm. Alternatively stated, the diameter dm3 (shown in FIG. 3D') of the first bonding surface 103 of the wafer 1 is reduced in a range from 2 mm to 6 mm in proximal to the first bonding surface 103. In some embodiments, the trimmed edge of the first wafer 1 may possess a depth d3 from about 0.01 μm to about 200 μm, measured from the first bonding surface 103 of the first wafer 1 to the bottom of the trimmed edge. The width w3 can at least be the radial portion of an unbond area but not too wide to reduce the radius of bond area. Determination of the depth d3 will be subsequently explained in FIG. 3E.

Figure 3D:
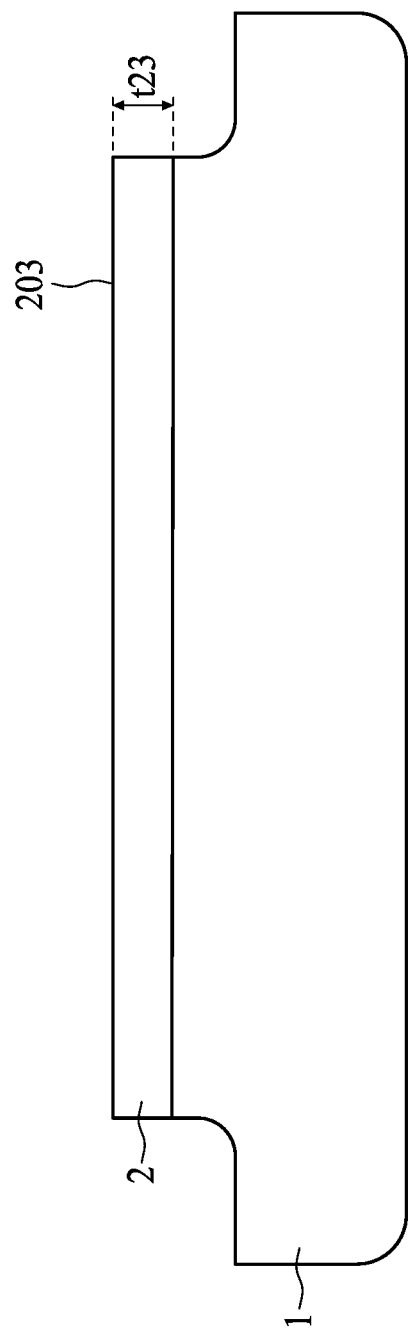

Referring to FIG. 3D, an epitaxial layer 2 is formed above the first bonding surface 103 of the wafer 1. In some embodiments, the thickness t23 of the epitaxial layer 2 is less than 10 μm. In some embodiments, before forming the epitaxial layer 2, a cleaning process, for example, a baseline cleaning, is applied on the first bonding surface 103 (Shown in FIG. 3C) of the first wafer 1 in order to remove metal ions.

In some embodiments, the material of the epitaxial layer 2 can be doped or undoped silicon germanium (SiGe). The epitaxial layer 2 may be formed by epitaxially growing a silicon germanium layer using a precursor free of chlorine. The precursor may include a silicon-containing source (such as SiH$_4$) and a germanium-containing source (such as GeH$_4$). However, the material of epitaxial layer 2 is not limited herein. The epitaxial layer 2 may include III-V compounds such as gallium nitride, gallium arsenide, or combinations of gallium, indium, aluminum, nitrogen, phosphorus or arsenic.

A surface area a3', as shown in FIG. 3D', of the epitaxial surface is reduced, compared to its untrimmed counterpart, that is, the untrimmed portion of the first wafer 1 under the epitaxial layer 2. For example, the bottom view of the first wafer 1 shows that the untrimmed counterpart possesses a transverse surface area a3, and the trimmed portion of the wafer possesses a transverse surface area a3'. Alternatively stated, the diameter dm3 of the surface area a3 is greater than the diameter dm3' of the surface area a3' by the width w3, as previously discussed.

Figure 3E:
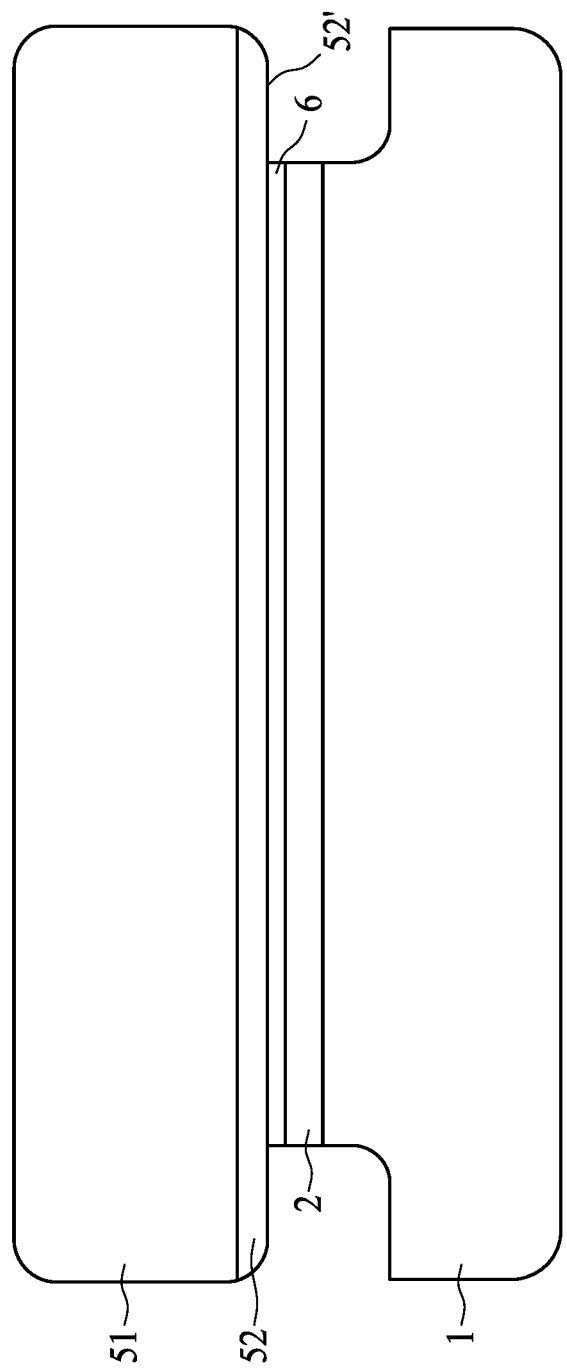

Wafer thinning is commonly used in semiconductor device manufacturing because thinning enables devices to be stacked and helps dissipate heat. However, thinner substrates are relatively more difficult to handle without damage to the substrate or to the integrated circuit components thereon. To alleviate some of the difficulties, device wafer is commonly attached to another wafer prior to the thinning operation. Referring to FIGS. 3E and 3E', an oxide layer 6 for bonding is formed above the top surface of the epitaxial layer 2, and the oxide layer 6 of the first wafer 1 can be bonded with the bonding layer 52 on a second bonding surface 52', while a transverse surface area a51 of the second wafer 51 is greater than the transverse surface area a3' of the trimmed portion of the first wafer 1, that is, a diameter dm51 of the second wafer 51 is greater than a diameter dm3' of the trimmed portion of the first wafer 1. In some embodiments, the first wafer 1 and the second wafer 51 are bonded by wafer-bonding level thermal annealing, as the oxide layer 6 may be formed by standard plasma activation-deposition, and the bonding layer 52 includes oxide such as SiO$_2$. The first wafer 1 and the second wafer 51 may also be bonded together through other suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like.

Referring to FIG. 3F, in some embodiments, the first wafer 1 is thinned by a backside grinding operation. The original thickness of the first wafer 1 is approximately 700 μm to 800 μm, and the thickness of the first wafer 1 will be reduced to less than 10 μm after the backside grinding operation, or until the backside surface area of the first wafer 1 is substantially equal to the transverse surface area a3'. Due to the potential cracks or breakage induced during the backside grinding operation, the depth d3 of the trimmed edge of the first wafer 1 must be far greater than 10 μm. In some embodiments, a trimmed depth between 0.01 μm to about 200 μm is determined considering potential crack propagation during the progress of thinning. Alternatively stated, an extra 40 μm to 190 μm of depth is preserved for potential crack propagation, so that sufficient thickness can be trimmed without affecting the 10 μm device region proximal to the bonding surface.

Referring to FIG. 4A through 4F, in some embodiments, a method for wafer bonding includes providing a first wafer 1 having a first bonding surface 104, forming a SiGe epitaxial layer 2, edge-trimming the first wafer 1 at the first bonding surface 104, cleaning the bonding surface by a basic and an acidic etch, and performing chemical mechanical polishing (CMP) on the first wafer 1.

Figure 4A:
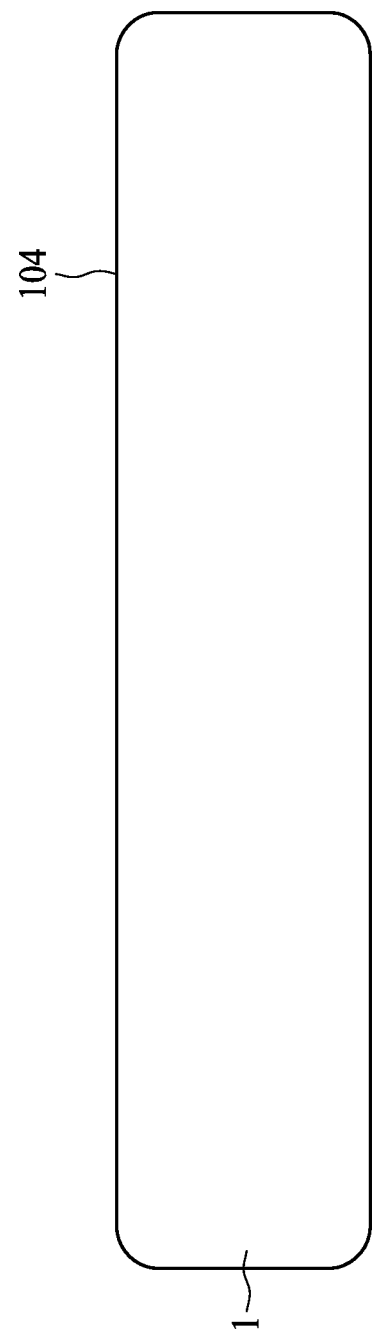
FIGS. 4A, 4B, 4C, 4C', and 4D are cross sections of forming an edge-trimmed wafer at various stages, in accordance with some embodiments of the present disclosure.
Figure 4B:
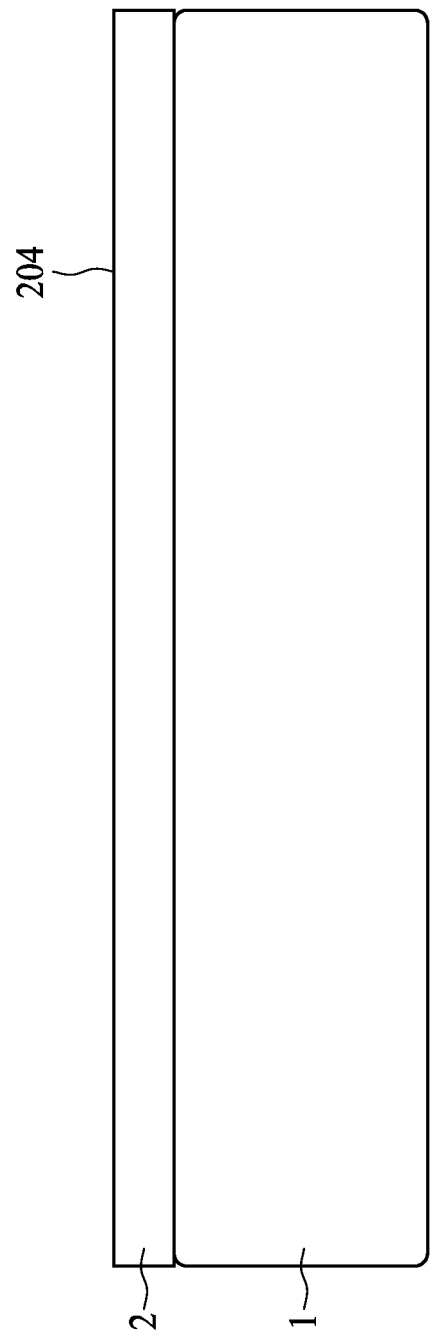

A first wafer 1 has a first bonding surface 104, as shown in FIG. 4A. Referring to FIG. 4B, an epitaxial layer 2 is formed above the first bonding surface 104 of the wafer 1. In some embodiments, before forming the epitaxial layer 2, a cleaning process, for example, a baseline cleaning, is applied on the first bonding surface 104 (Shown in FIG. 1B) of the first wafer 1 in order to remove metal ions. In some embodiments, the material of the epitaxial layer 2 can be doped or undoped silicon germanium (SiGe). The epitaxial layer 2 may be formed by epitaxially growing a silicon germanium layer using a precursor free of chlorine. The precursor may include a silicon-containing source (such as $SiH_4$) and a germanium-containing source (such as $GeH_4$). However, the material of epitaxial layer 2 is not limited herein. The epitaxial layer 2 may include III-V compounds such as gallium nitride, gallium arsenide, or combinations of gallium, indium, aluminum, nitrogen, phosphorus or arsenic.

Figure 4C:
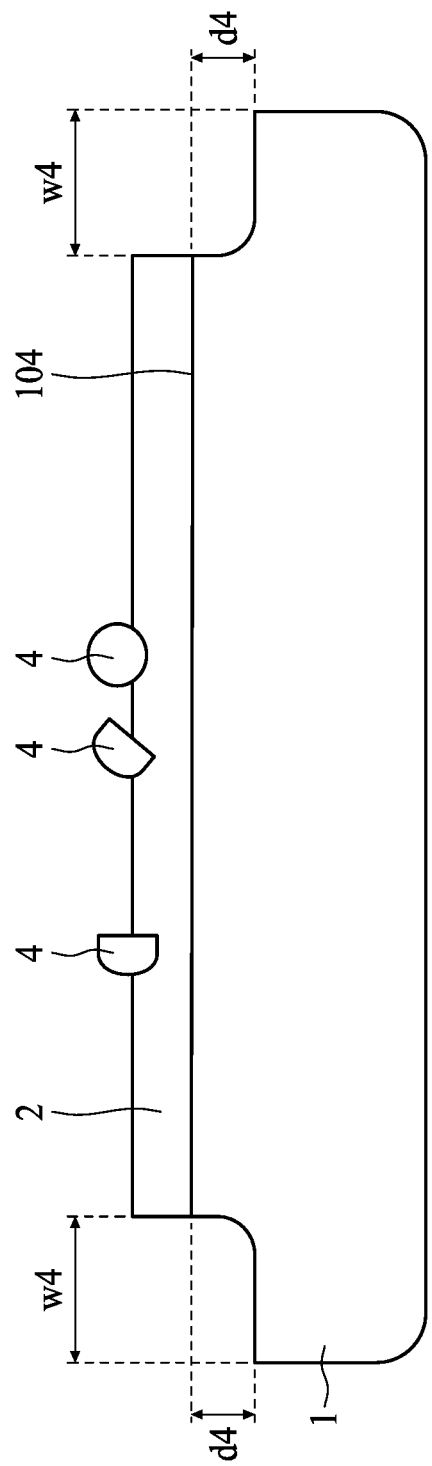
Figure 4C:
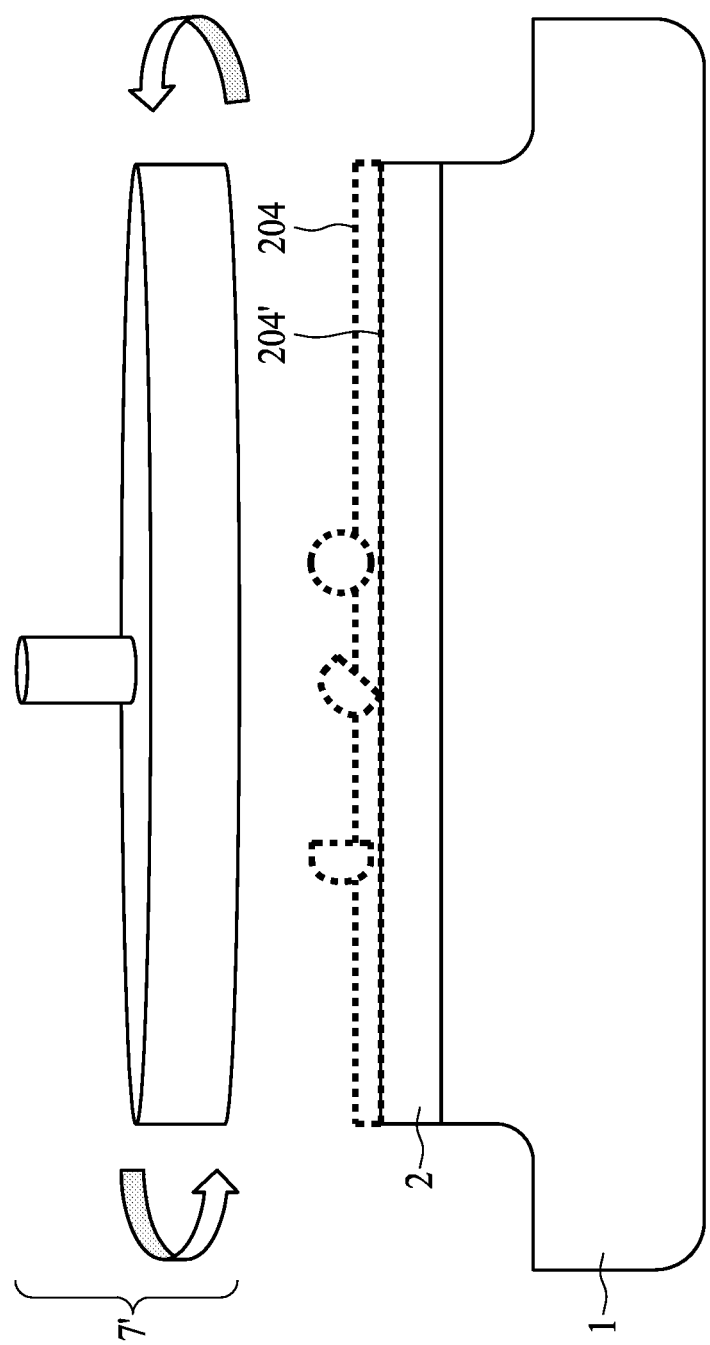

The edge of the first wafer 1, which is a non-bond area, is prone to peel or crack during the manufacturing process and further induce defects or damage on the device. Therefore the edge of the first wafer 1 needs to be trimmed before wafer bonding and/or thinning operation. Referring to FIG. 4C, the edge of the first wafer 1 is trimmed. In some embodiments, the first wafer 1 is spun while a trimming tool (not shown in FIG. 4C) removes a predetermined portion of the edge around the first bonding surface 104 of the first wafer 1. In some embodiments, the first wafer 1 is spun while a trimming tool (not shown in FIG. 4C) removes a predetermined portion of the edge around the surface 204 of the epitaxial layer 2. In some embodiments, the trimmed edge of the first wafer 1 can be figured with a width w4 radially inward from about 1 mm to about 3 mm, and with a depth d4 from about 0.01 μm to about 200 μm, measured from the first bonding surface 104 of the first wafer 1 to the bottom of the trimmed edge. The width w4 can at least be the radial portion of an unbond area but not too wide to reduce the radius of bond area. Determination of the depth d4 will be subsequently explained in FIG. 4F.

During the process of trimming the wafer edge, a great number of particles 4 may be ejected from the wafer edge, splattered over and damage the top surface 204 of the epitaxial layer 2. In order to remove the particles 4 on the top surface 204 of the epitaxial layer 2, a silicon germanium chemical mechanical polishing (SiGe CMP) process 7' is applied on the top surface 204 of the epitaxial layer 2, as shown in FIG. 4C'. After applying the SiGe CMP process 7', the epitaxial layer 2 will be thinned, as the top surface of the epitaxial layer 2 lowered from the surface 204 to a surface 204'. In some embodiments, the thickness t24 between the top surface 204' and the first bonding surface 104 of the wafer 1 is less than 10 μm, as shown in FIG. 4D.

Figure 4D:
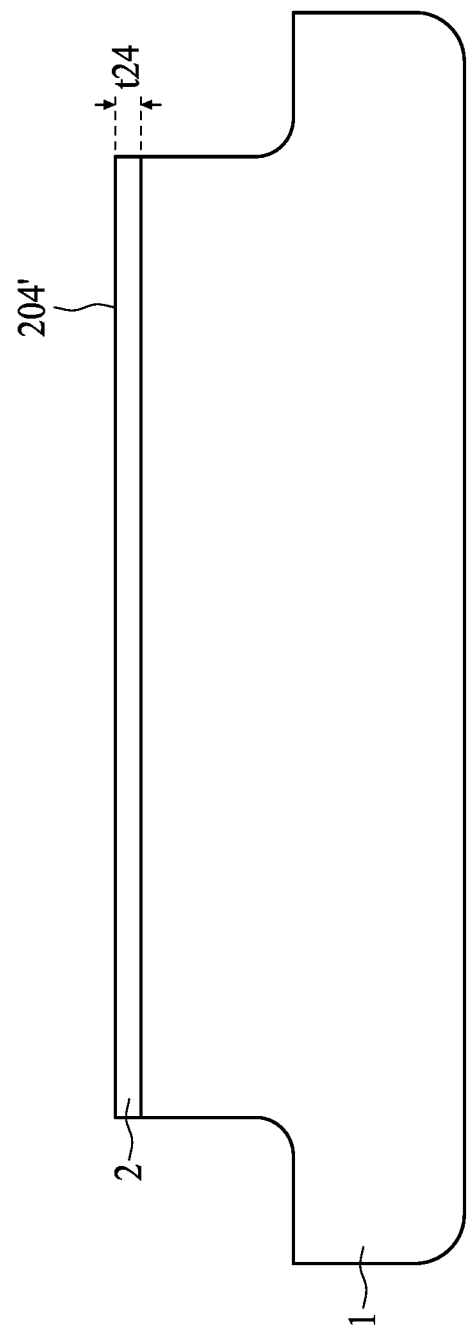
FIG. 4D' is bottom view of wafer bonding at an intermediate stage, in accordance with some embodiments of the present disclosure.

A surface area a4', as shown in FIG. 4D', of the epitaxial surface is reduced, compared to its untrimmed counterpart, that is, the untrimmed portion of the first wafer 1 under the epitaxial layer 2. For example, the bottom view of the first wafer 1 shows that the untrimmed counterpart possesses a transverse surface area a4, and the trimmed portion of the wafer possesses a transverse surface area a4'. Alternatively stated, the diameter dm4 of the surface area a4 is greater than the diameter dm4' of the surface area a4' by the width w4, as previously discussed.

Figure 4E:
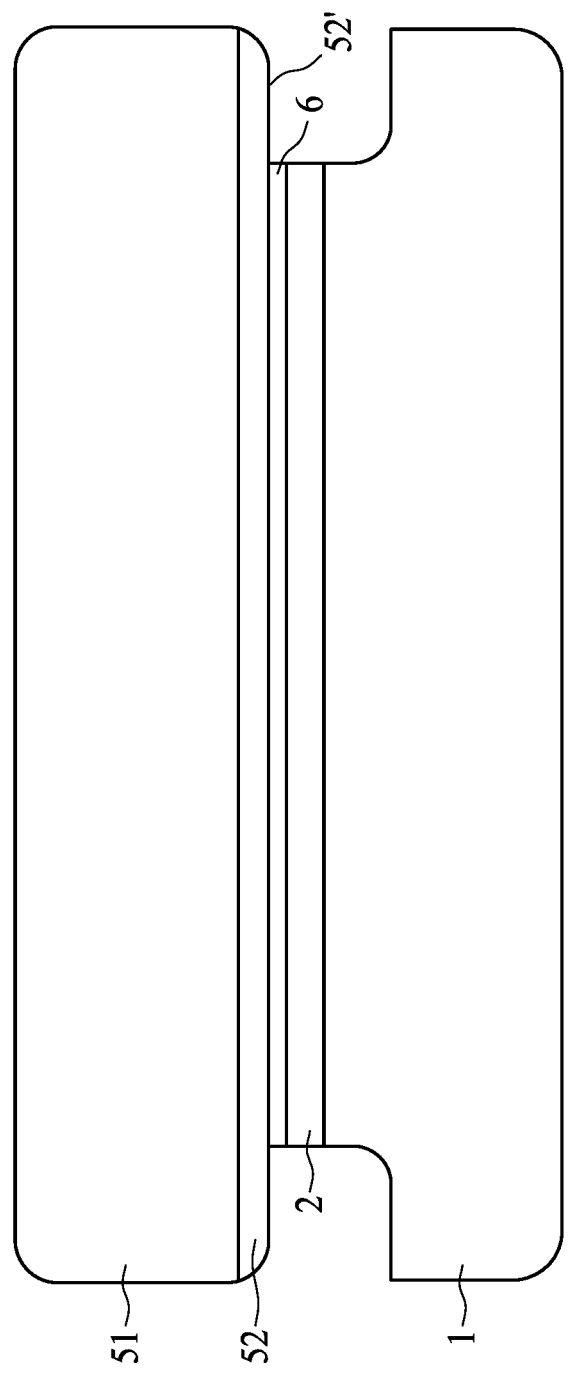
FIG. 4E is cross sections of forming an edge-trimmed wafer at various stages, in accordance with some embodiments of the present disclosure.

Wafer thinning is commonly used in semiconductor device manufacturing because thinning enables devices to be stacked and helps dissipate heat. However, thinner substrates are relatively more difficult to handle without damage to the substrate or to the integrated circuit components thereon. To alleviate some of the difficulties, device wafer is commonly attached to another wafer prior to the thinning operation. Referring to FIGS. 4E and 4E', an oxide layer 6 for bonding is formed above the top surface of the epitaxial layer 2, and the oxide layer 6 of the first wafer 1 can be bonded with the bonding layer 52 on a second bonding surface 52', while a transverse surface area a51 of the second wafer 51 is greater than the transverse surface area a4' of the trimmed portion of the first wafer 1, that is, a diameter dm51 of the second wafer 51 is greater than a diameter dm4' of the trimmed portion of the first wafer 1. In some embodiments, the first wafer 1 and the second wafer 51 are bonded by wafer-bonding level thermal annealing, as the oxide layer 6 may be formed by standard plasma activation-deposition, and the bonding layer 52 includes oxide such as $SiO_2$. The first wafer 1 and the second wafer 51 may also be bonded together through other suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like.

Figure 4F:
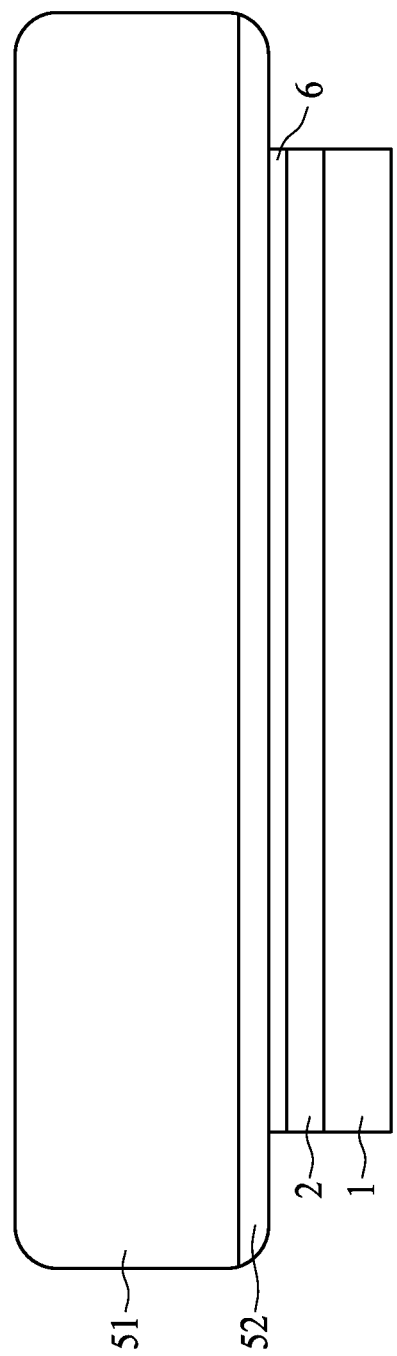
FIG. 4F is cross sections of forming an edge-trimmed wafer at various stages, in accordance with some embodiments of the present disclosure.

Referring to FIG. 4F, in some embodiments, the first wafer 1 is thinned by a backside grinding operation. The original thickness of the first wafer 1 is approximately 700 μm to 800 μm, and the thickness of the first wafer 1 will be reduced to less than 10 μm after the backside grinding operation, or until the backside surface area of the first wafer 1 is substantially equal to the transverse surface area a4'. Due to the potential cracks or breakage induced during the backside grinding operation, the depth d4 of the trimmed edge of the first wafer 1 must be far greater than 10 μm. In some embodiments, a trimmed depth between 0.01 μm to about 200 μm is determined considering potential crack propagation during the progress of thinning. Alternatively stated, an extra 40 μm to 190 μm of depth is preserved for potential crack propagation, so that sufficient thickness can be trimmed without affecting the 10 μm device region proximal to the bonding surface.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a method for wafer bonding, including providing a wafer, forming a sacrificial layer on a top surface of the first wafer, trimming an edge of the first wafer to obtain a first wafer area, cleaning the top surface of the first wafer, removing the sacrificial layer, and bonding the top surface of the first wafer to a second wafer having a second wafer area greater than the first wafer area.

Some embodiments of the present disclosure provide method for wafer bonding, including providing a first wafer having a first bonding surface, edge-trimming the first wafer at the first bonding surface, cleaning the bonding surface by a basic and an acidic etch, and performing chemical mechanical polishing (CMP) on the first wafer.

Some embodiments of the present disclosure provide a method for forming an edge-trimmed wafer, including providing a wafer having a first surface, edge-trimming the wafer at the first surface by reducing a diameter of the wafer in a range of from about 2 mm to about 6 mm and reducing a thickness of the wafer in a range of from about 0.01 µm to about 200 µm, and cleaning the first surface by a basic and an acidic etch.

What is claimed is:

1. A method for wafer bonding, comprising:
   providing a first wafer;
   forming a sacrificial layer on a top surface of the first wafer;
   trimming an edge of the first wafer to obtain a first wafer area;
   cleaning the top surface of the first wafer;
   removing the sacrificial layer;
   bonding the top surface of the first wafer to a second wafer having a second wafer area greater than the first wafer area; and
   thinning the first wafer from a bottom surface opposite to the top surface after trimming the edge of the first wafer, until a trimmed edge is reached.

2. The method of claim 1, wherein a thickness of the sacrificial layer is between 500 angstrom to 50000 angstrom.

3. The method of claim 1, wherein the cleaning the top surface of the first wafer comprises a basic and an acidic etching to the top surface.

4. The method of claim 1, further comprising forming an epitaxial layer after forming the sacrificial layer.

5. The method of claim 1, further comprising forming a bonding layer over the second wafer prior to bonding the first wafer to the second wafer.

6. The method of claim 1, further comprising forming an oxide layer over the top surface of the first wafer subsequent to removing the sacrificial layer.

7. The method of claim 1, further comprising forming an epitaxial layer before forming the sacrificial layer.

8. The method of claim 7, wherein a width of a trimmed edge of the first wafer is in a range of from about 1 mm to about 3 mm.

9. The method of claim 8, wherein a depth of the trimmed edge of the first wafer is in a range of from about 0.01 µm to about 200 µm.

10. A method for wafer bonding, comprising:
    providing a first wafer having a first bonding surface;
    edge-trimming the first wafer at the first bonding surface;
    cleaning the first bonding surface; and
    performing chemical mechanical polishing (CMP) on the first bonding surface.

11. The method of claim 10, further comprising forming a SiGe expitaxial layer over the first bonding surface before the edge-trimming and performing the CMP on the SiGe epitaxial layer of the first wafer.

12. The method of claim 10, further comprising forming a SiGe expitaxial layer over the first bonding surface after the edge-trimming and performing the CMP on the bonding surface of the first wafer.

13. The method of claim 10, wherein the edge-trimming comprises reducing a diameter of the first wafer in a range of from about 2 mm to about 6 mm in proximal to the first bonding surface.

14. The method of claim 10, wherein the edge-trimming comprises reducing a thickness of the first wafer in a range of from about 0.01 µm to about 200 µm in proximal to the first bonding surface.

15. The method of claim 10, further comprising bonding the first wafer having a first diameter at the first bonding surface to a second wafer having a second diameter at a second bonding surface, the second diameter being greater than the first diameter.

16. The method of claim 10, wherein the CMP is performed subsequent to cleaning the first bonding surface.

17. A method for forming an edge-trimmed wafer, comprising:
    providing a wafer having a first surface;
    edge-trimming the wafer at the first surface by reducing a diameter of the wafer in a range of from about 2 mm to about 6 mm and reducing a thickness of the wafer in a range of from about 0.01 µm to about 200 µm;
    cleaning the first surface by a basic and an acidic etch; and
    performing a chemical mechanical polishing (CMP) on the first surface after cleaning the first surface.

18. The method of claim 17, further comprising ashing and hydrogen fluoride etching after the CMP.

19. The method of claim 17, further comprising forming a sacrificial layer over the first surface prior to the edge-trimming at the first surface.

20. The method of claim 19, further comprising removing the sacrificial layer after the edge-trimming at the first surface.

* * * * *